United States Patent
Akaike et al.

(10) Patent No.: US 8,581,670 B2
(45) Date of Patent: *Nov. 12, 2013

(54) OSCILLATION DEVICE

(75) Inventors: Kazuo Akaike, Sayama (JP); Kaoru Kobayashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/353,942

(22) Filed: Jan. 19, 2012

(65) Prior Publication Data

US 2012/0194277 A1   Aug. 2, 2012

(30) Foreign Application Priority Data

Jan. 28, 2011   (JP) .................................. 2011-016698

(51) Int. Cl.
*H03B 5/36*   (2006.01)

(52) U.S. Cl.
USPC ... 331/158; 331/176; 331/116 R; 331/116 FE

(58) Field of Classification Search
USPC .......................... 331/158, 116 R, 116 FE, 176
See application file for complete search history.

(56) References Cited

U.S. PATENT DOCUMENTS

| | | | |
|---|---|---|---|
| 5,200,714 A * | 4/1993 | Hayashi | 331/66 |
| 5,214,668 A | 5/1993 | Satou et al. | |
| 6,545,550 B1 | 4/2003 | Frerking | |

FOREIGN PATENT DOCUMENTS

| | | |
|---|---|---|
| GB | 2 251 143 | 6/1992 |
| JP | 59-095431 | 6/1984 |

* cited by examiner

*Primary Examiner* — Arnold Kinkead
(74) *Attorney, Agent, or Firm* — Jordan and Hamburg LLP

(57) ABSTRACT

To perform, in an oscillation device compensating an output frequency based on a detection result of ambient temperature, temperature compensation of the output frequency with high accuracy. First and second quartz-crystal oscillators are structured by using a common quartz-crystal piece, and when oscillation outputs of first and second oscillation circuits respectively connected to these quartz-crystal oscillators are set to f1, f2, and oscillation frequencies of the first and the second oscillation circuits at a reference temperature are set to f1r, f2r, respectively, a frequency difference being a difference between a value corresponding to a difference between f1 and f1r and a value corresponding to a difference between f2 and f2r is treated as a temperature at that time. Further, based on the frequency difference, a frequency compensation value is determined through polynomial approximation.

9 Claims, 13 Drawing Sheets (a) OUTPUT OF DDS, LATCH POINT (b) OUTPUT OF LATCH (c) OUTPUT OF LOOP FILTER (a) OUTPUT OF DDS, LATCH POINT (b) OUTPUT OF LATCH (c) OUTPUT OF LOOP FILTER (a)

(b)

OSCILLATION DEVICE

BACKGROUND OF THE INVENTION

1. Field of the Invention

The present invention relates to an oscillation device detecting a temperature at which a quartz-crystal oscillator is placed, and conducting temperature compensation of an output frequency based on a result of the temperature detection.

2. Description of the Related Art

Normally, when a quartz-crystal oscillator is incorporated in an application to which quite high frequency stability is required, an OCXO is generally used, but, the OCXO is formed of a large-scale device, and thus has a large power consumption. For this reason, it is considered to use a TCXO with a simple structure and small power consumption, but, the TCXO has a disadvantage that a frequency stability with respect to a temperature is inferior to that of the OCXO.

FIG. 13 shows a general structure of the TCXO. 90 denotes a quartz-crystal oscillator and 91 denotes an oscillation circuit, and by changing a control voltage supplied from a control voltage generating unit 93 to a voltage variable capacitance element 92, a capacitance of the voltage variable capacitance element 92 is controlled to adjust an oscillation frequency (output frequency).

A frequency of the quartz-crystal oscillator 90 changes in accordance with a temperature, so that the control voltage generating unit 93 compensates the control voltage in accordance with a temperature detected by a temperature detector 94. Concretely, a cubic function, for example, being a function in which a frequency-temperature characteristic of the quartz-crystal oscillator 90 is normalized by a reference temperature is stored in a memory 95, and a frequency corresponding to a temperature detection value is read based on this function (frequency-temperature characteristic). Specifically, how much a frequency at a temperature at that time is deviated from a frequency at the reference temperature is read, and a control voltage corresponding to a deviation amount of the frequency is set as an amount of temperature compensation, and is subtracted from a control voltage corresponding to the frequency at the reference temperature.

However, when the temperature compensation control is tried to be finely conducted, an amount of data for specifying the function of the frequency-temperature characteristic becomes large, and a large-capacity memory is required as the memory 95, resulting in that the memory 95 becomes expensive. Further, a thermistor is normally used as the temperature detector, so that even when the amount of data is enlarged, an improvement in frequency accuracy cannot be expected due to a limit in detection accuracy of the temperature detector.

Further, since the temperature detector 94 and the quartz-crystal oscillator 90 are disposed at different positions, it is not possible to correctly obtain actual temperature information of the quartz-crystal oscillator 90, and from this point as well, the improvement in frequency accuracy cannot be expected.

In FIG. 2 and FIG. 3 of Patent Document 1, it is described to structure two quartz-crystal oscillators (quartz-crystal resonators) by providing two pairs of electrodes on a common quartz-crystal piece. Further, paragraph 0018 describes that a frequency difference appears between the two quartz-crystal oscillators in accordance with a temperature change, and measuring of this frequency difference is equivalent to measuring of temperature. Further, a relation between this frequency difference Δf and an amount of frequency to be compensated is stored in a ROM, and an amount of frequency compensation is read based on Δf.

However, as described in paragraph 0019, this method is required to adjust the quartz-crystal oscillators so that, regarding a desired output frequency f0 and respective frequencies f1, f2 of the two quartz-crystal oscillators, a relation of f0≈f1≈f2 is satisfied, and thus there are problems that a manufacturing process of the quartz-crystal oscillators becomes complicated, and besides, it is not possible to achieve high yield.

Furthermore, as shown in FIG. 4, clocks being frequency signals from the respective quartz-crystal oscillators are counted for a given period of time, and a difference between the clocks (f1−f2) is determined, so that a detection time directly influences on a detection accuracy, which makes it difficult to realize high-accuracy temperature compensation.

[Patent Document 1] Japanese Patent Application Laid-open No. 2001-292030

SUMMARY OF THE INVENTION

The present invention has been made under such circumstances, and an object thereof is to provide an oscillation device capable of performing temperature compensation of an output frequency with high accuracy.

The present invention is characterized to be structured such that, in an oscillation device compensating an output frequency based on a detection result of ambient temperature, there are provided: a first quartz-crystal oscillator structured by providing first electrodes on a quartz-crystal piece; a second quartz-crystal oscillator structured by providing second electrodes on the quart-crystal piece shared with the first quartz-crystal oscillator; a first oscillation circuit and a second oscillation circuit connected to these first quartz-crystal oscillator and second quartz-crystal oscillator, respectively; a frequency difference detecting unit determining, when an oscillation frequency of the first oscillation circuit is set to f1, an oscillation frequency of the first oscillation circuit at a reference temperature is set to f1r, an oscillation frequency of the second oscillation circuit is set to f2, and an oscillation frequency of the second oscillation circuit at the reference temperature is set to f2r, a value corresponding to a difference value between a value corresponding to a difference between f1 and f1r, and a value corresponding to a difference between f2 and f2r; and a compensation value obtaining unit obtaining a frequency compensation value of f1 because the ambient temperature is different from the reference temperature, based on the value corresponding to the difference value detected by the frequency difference detecting unit, and a relation between the value corresponding to the difference value and the frequency compensation value of the oscillation frequency f1 of the first oscillation circuit, in which the output frequency is compensated based on the frequency compensation value determined by the compensation value obtaining unit.

The value corresponding to the difference value between the value corresponding to the difference between f1 and f1r and the value corresponding to the difference between f2 and f2r is, for example, [{(f2−f2r)/f2r}−{(f1−f1r)/f1r}].

The compensation value obtaining unit can be structured to obtain the frequency compensation value of f1 through calculation, based on a relational expression specifying the relation between the value corresponding to the difference value and the frequency compensation value of the oscillation frequency f1 of the first oscillation circuit.

The frequency difference detecting unit can be structured as follows, for example.

There are provided: a pulse creating section creating a pulse of difference frequency between the f1 and f2; a DDS circuit section outputting a frequency signal whose signal value repeatedly increases and decreases with time by a frequency in accordance with a magnitude of an input direct-current voltage; a latch circuit latching, based on the pulse created by the pulse creating section, the frequency signal output from the DDS circuit section; a loop filter integrating a value of the signal latched by the latch circuit and outputting the integral value as the frequency difference; and an adding section obtaining a difference between the output of the loop filter and a value corresponding to a difference between f1r and f2r to set it as an input value to be input into the DDS circuit section.

Further, the present invention may also have a structure such that a quartz-crystal oscillator to be a target of frequency compensation and one of the first quartz-crystal oscillator and the second quartz-crystal oscillator that form a sort of thermometer are not made common.

In the present invention, in the oscillation device compensating the output frequency based on the detection result of the ambient temperature, when the oscillation outputs of the first and the second oscillation circuits are set to f1 and f2, respectively, and the oscillation frequencies of the first and the second oscillation circuits at the reference temperature are set to f1r and f2r, respectively, the value corresponding to the difference value between the value corresponding to the difference between f1 and f1r and the value corresponding to the difference between f2 and f2r, is designed to be treated as a temperature at that time, and since a correlation between the value and the temperature is quite high, it is possible to perform the temperature compensation of the output frequency with high accuracy.

DETAILED DESCRIPTION OF THE PREFERRED EMBODIMENT(S)

Figure 1:
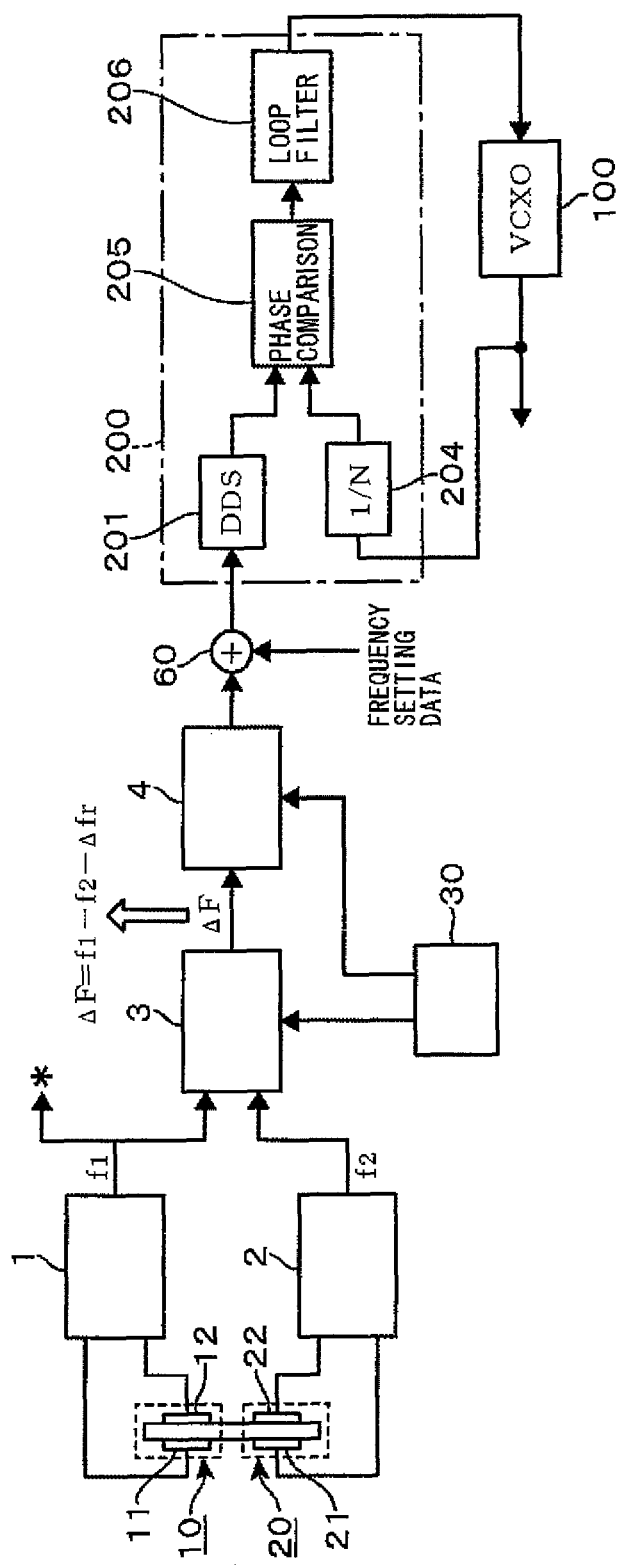
FIG. 1 is a block diagram showing an entire structure of an embodiment of the present invention.

FIG. 1 is a block diagram showing an entire embodiment of an oscillation device of the present invention. This oscillation device is structured as a frequency synthesizer that outputs a frequency signal of a set frequency, and includes a voltage controlled oscillator 100 using a quartz-crystal oscillator, a control circuit unit 200 that structures a PLL in the voltage controlled oscillator 100, and a temperature compensation unit that performs temperature compensation of reference clock input into the control circuit unit 200. Although a reference numeral is not given to the temperature compensation unit, the unit corresponds to a part on the left side of the control circuit unit 200 in FIG. 1.

The control circuit unit 200 compares, in a phase frequency comparison section 205, a phase of reference clock output from a DDS (Direct Digital Synthesizer) circuit section 201 with a phase of clock as a result of frequency-dividing an output of the voltage controlled oscillator 100 in a frequency divider 204, and a phase difference being a result of the comparison is analog-converted by a not-shown charge pump. The analog-converted signal is input into a loop filter 206 and controlled so that a PLL (Phase locked loop) is stabilized. Therefore, it is also possible to say that the control circuit unit 200 is a PLL unit. Here, the DDS circuit section 201 uses a frequency signal output from a later-described first oscillation circuit 1 as the reference clock, and frequency data (digital value) for outputting a signal of intended frequency is input therein.

However, a frequency of the reference clock has a temperature characteristic, so that in order to cancel the temperature characteristic, a signal corresponding to a later-described frequency compensation value is added, in an adding section 60, to the frequency data input into the DDS circuit section 201. By compensating the frequency data input into the DDS circuit section 201, the output frequency of the DDS circuit section 201 corresponding to an amount of temperature variation based on an amount of variation in the temperature characteristic of the reference clock is cancelled, resulting in that a frequency of reference clock is stabilized with respect to the temperature variation, and accordingly, an output frequency from the voltage controlled oscillator 100 is stabilized.

The temperature compensation unit includes a first quartz-crystal oscillator 10 and a second quartz-crystal oscillator 20, and these first quartz-crystal oscillator 10 and second quartz-crystal oscillator 20 are structured by using a common quartz-crystal piece Xb. Specifically, for example, an area of the quartz-crystal piece Xb with a strip shape is divided into two in a longitudinal direction, and excitation electrodes are provided on both front and rear surfaces of the respective divided areas (oscillation areas). Therefore, one divided area and a pair of electrodes 11, 12 form the first quartz-crystal oscillator 10, and the other divided area and a pair of electrodes 21, 22 form the second quartz-crystal oscillator 20. For this reason, it can be said that the first quartz-crystal oscillator 10 and the second quartz-crystal oscillator 20 are thermally coupled.

To the first quartz-crystal oscillator 10 and the second quartz-crystal oscillator 20, a first oscillation circuit 1 and a second oscillation circuit 2 are respectively connected. Each of outputs of these oscillation circuits 1, 2 may be an overtone (harmonic) of each of the quartz-crystal oscillators 10, 20, or may also be a fundamental wave of each of the oscillators, for example. When the output of overtone is obtained, it is also possible to design such that a tuning circuit for overtone is provided in an oscillation loop formed of a quartz-crystal oscillator and an amplifier, for example, and the oscillation loop is oscillated by the overtone. Alternatively, it is also possible to design such that the oscillation loop is oscillated by the fundamental wave, a class C amplifier is provided at a subsequent stage of an oscillation stage, namely, at a subsequent stage of an amplifier being a part of Colpitts circuit, for example, to distort the fundamental wave using the class C amplifier, and a tuning circuit tuned to the overtone is provided at a subsequent stage of the class C amplifier, thereby, resultingly, a third overtone oscillation frequency, for instance, is output from each of the oscillation circuits 1, 2.

Here, for convenience, if it is set such that a frequency signal of a frequency f1 is output from the first oscillation circuit 1, and a frequency signal of a frequency f2 is output from the second oscillation circuit 2, the frequency signal of the frequency f1 is supplied to the control circuit unit 200 as a reference clock. 3 denotes a frequency difference detecting unit, and, schematically speaking, this frequency difference detecting unit 3 is a circuit unit for obtaining ΔF=f2−f1−Δfr, being a difference between a difference between f1 and f2, and Δfr. Δfr is a difference between f1 and f2 at a reference temperature, which is, for example, 25° C. The difference between f1 and f2 is, for example, several MHz, as an example. The present invention is realized by calculating, with the use of the frequency difference detecting unit 3, ΔF being a difference between a value corresponding to the difference between f1 and f2 and a value corresponding to the difference between f1 and f2 at the reference temperature, which is, for example, 25° C. In a case of this embodiment, more specifically speaking, a value obtained by the frequency difference detecting unit 3 is {(f2−f1)/f1}−{(f2r−f1r)/f1r}. However, a display of an output of the frequency difference detecting unit 3 is briefly described in the drawing.

Figure 2:
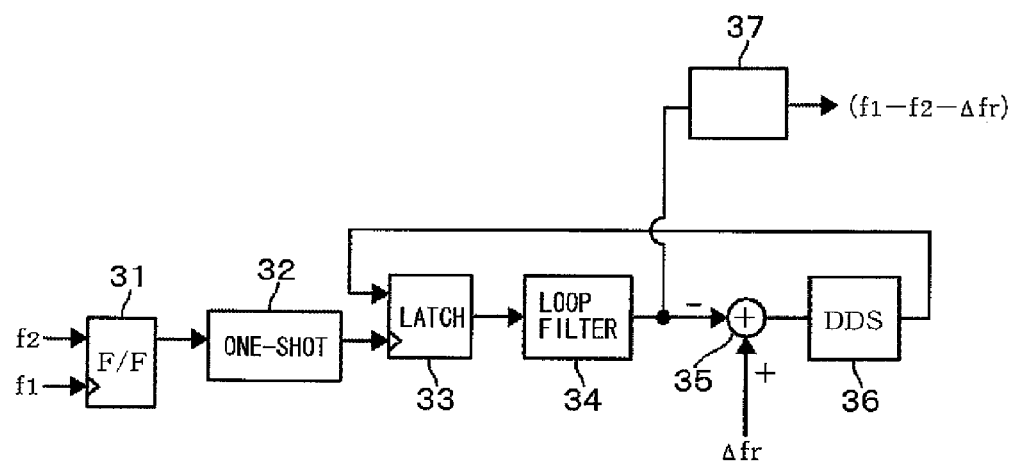
FIG. 2 is a block diagram showing a part of the embodiment of the present invention.

FIG. 2 shows a concrete example of the frequency difference detecting unit 3. 31 denotes a flip-flop circuit (F/F circuit), in which the frequency signal of the frequency f1 from the first oscillation circuit 1 is input into one input end of the flip-flop circuit 31, and the frequency signal of the frequency f2 from the second oscillation circuit 2 is input into the other input end of the flip-flop circuit 31, and the flip-flop circuit 31 latches the frequency signal of the frequency f2 from the second oscillation circuit 2 based on the frequency signal of the frequency f1 from the first oscillation circuit 1. In the description hereinbelow, to avoid the redundancy of description, f1, f2 are treated such that they represent frequencies or frequency signals themselves. From the flip-flop circuit 31, a signal having a frequency of (f2−f1)/f1, being the value corresponding to the frequency difference between f1 and f2 is output.

Figure 3:
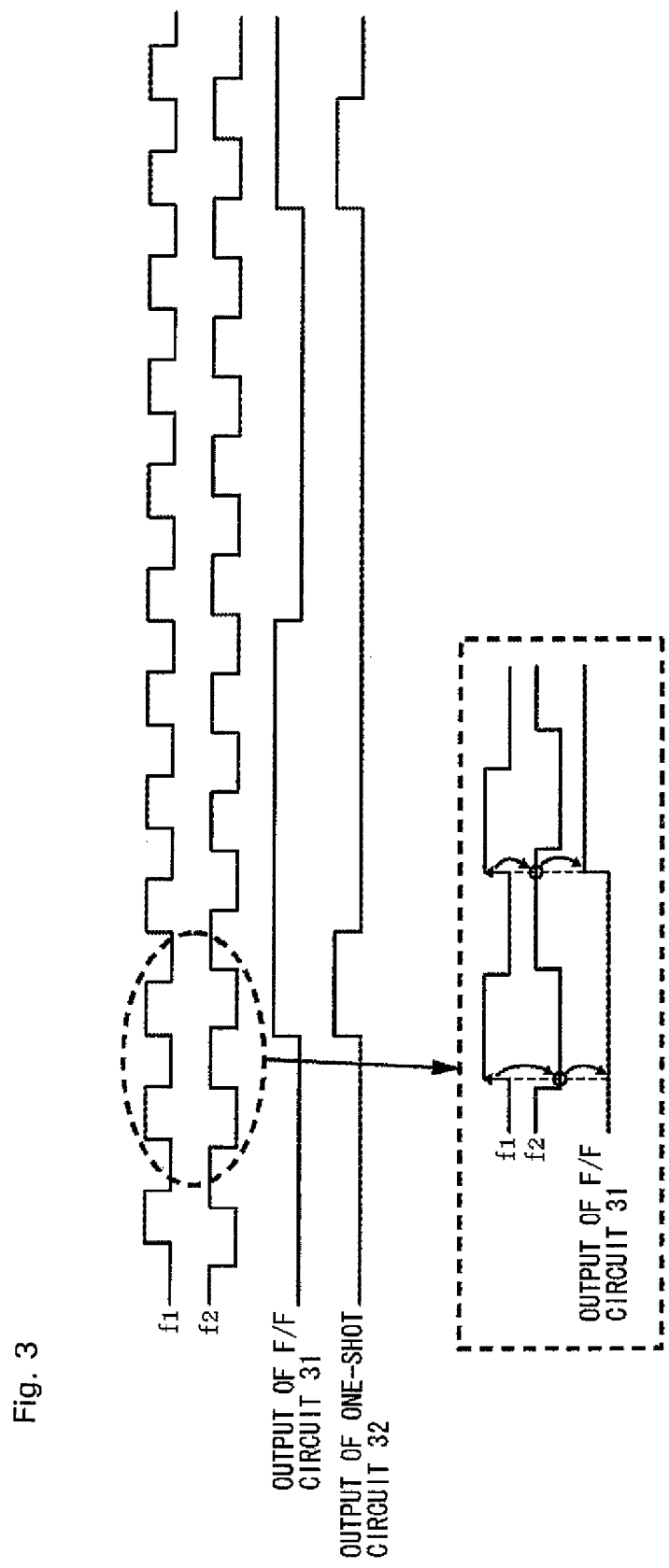
FIG. 3 is a waveform diagram of outputs of a part shown in FIG. 2.

A one-shot circuit 32 is provided at a subsequent stage of the flip-flop circuit 31, and the one-shot circuit 32 outputs a one-shot pulse at a rising edge of a pulse signal obtained from the flip-flop circuit 31. FIG. 3 is time diagrams showing a series of signals described so far.

At a subsequent stage of the one-shot circuit 32, a PLL (Phase Locked Loop) is provided, and the PLL is structured by a latch circuit 33, a loop filter 34 having an integrating function, an adding section 35 and a DDS circuit section 36. The latch circuit 33 is for latching a saw-tooth wave output from the DDS circuit section 36, based on the pulse output from the one-shot circuit 32, and an output of the latch circuit 33 corresponds to a signal level of the saw-tooth wave at a timing at which the pulse is output. The loop filter 34 integrates a direct-current voltage being the signal level, and the adding section 35 adds the direct-current voltage and a direct-current voltage corresponding to Δfr. Data corresponding to the direct-current voltage corresponding to Δfr is stored in the memory 30 shown in FIG. 2.

Figure 4:
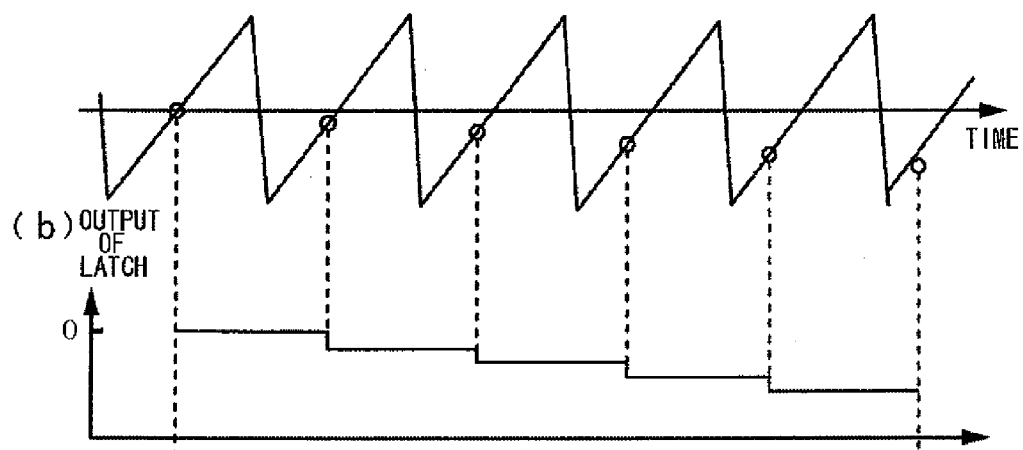
FIGS. 4(a), 4(b) and 4(c) are waveform diagrams of respective sections schematically showing an unlocked state in a loop including a DDS circuit section shown in FIG. 2.
Figure 4:
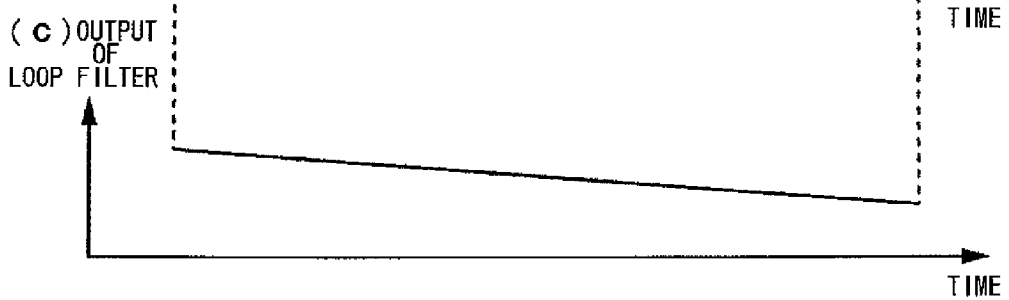

In this example, regarding a sign in the adding section 35, "+" is given to an input side of the direct-current voltage corresponding to Δfr, and "−" is given to an input side of the output voltage of the loop filter 34. To the DDS circuit section 36, a direct-current voltage calculated by the adding section 35, namely, a voltage as a result of subtracting the output voltage of the loop filter 34 from the direct-current voltage corresponding to Δfr is input, and a saw-tooth wave of a frequency in accordance with a value of the voltage is output from the DDS circuit section 36. For easier understanding of an operation of the PLL, states of outputs of the respective sections are quite schematically shown in FIG. 4. At a time of starting the device, the direct-current voltage corresponding to Δfr is input into the DDS circuit section 36 through the adding section 35, and, if Δfr is 5 MHz, for example, a saw-tooth wave of a frequency in accordance with the frequency is output from the DDS circuit section 36.

Figure 5:
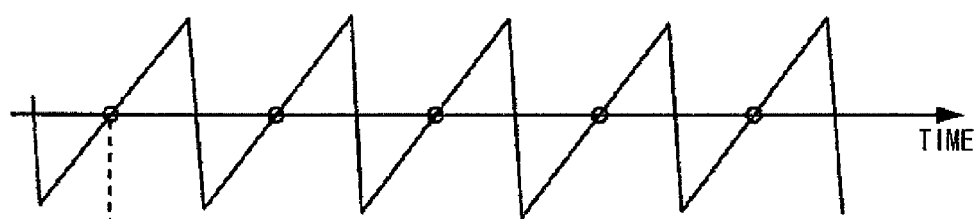
FIGS. 5(a), 5(b) and 5(c) are waveform diagrams of the respective sections schematically showing a locked state in the loop including the DDS circuit section shown in FIG. 2.
Figure 5:
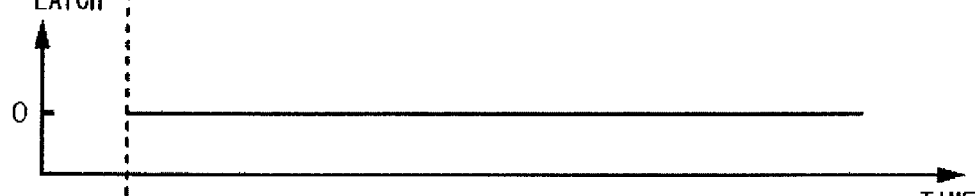
Figure 5:

The saw-tooth wave is latched by the latch circuit 33 based on a pulse of frequency corresponding to (f2−f1), and, if (f2−f1) is 6 MHz, for example, a period of the pulse for latch is shorter than that of the saw-tooth wave, so that a latch point of the saw-tooth wave is gradually lowered as shown in FIG. 4(a), and the output of the latch circuit 33 and the output of the loop filter 34 are gradually lowered on the − side as shown in FIGS. 4(b) and 4(c). Since the sign in the adding section 35 on the output side of the loop filter 34 is "−", the direct-current voltage input into the DDS circuit section 36 from the adding section 35 increases. Accordingly, the frequency of the saw-tooth wave output from the DDS circuit section 36 becomes high, and when the direct-current voltage corresponding to 6 MHz is input into the DDS circuit section 36, the frequency of the saw-tooth wave becomes 6 MHz, and the PLL is locked as shown in FIGS. 5(a) to 5(c). The direct-current voltage output from the loop filter 34 at this time takes a value corresponding to Δfr−(f2−f1)=−1 MHz. Specifically, it can be said that an integral value of the loop filter 34 corresponds to an integral value of an amount of change of 1 MHz when the frequency of the saw-tooth wave is changed from 5 MHz to 6 MHz.

Figure 6:
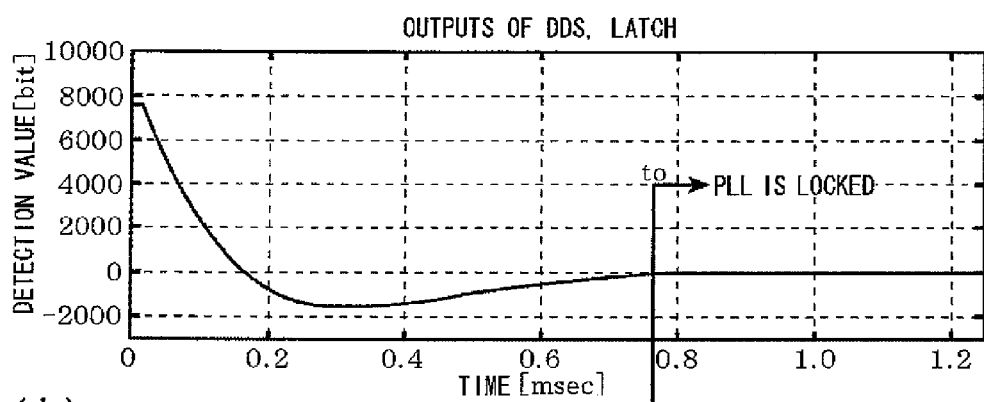
FIGS. 6(a) and 6(b) are waveform diagrams of the respective sections in the loop in an actual device corresponding to the aforementioned embodiment.
Figure 6:
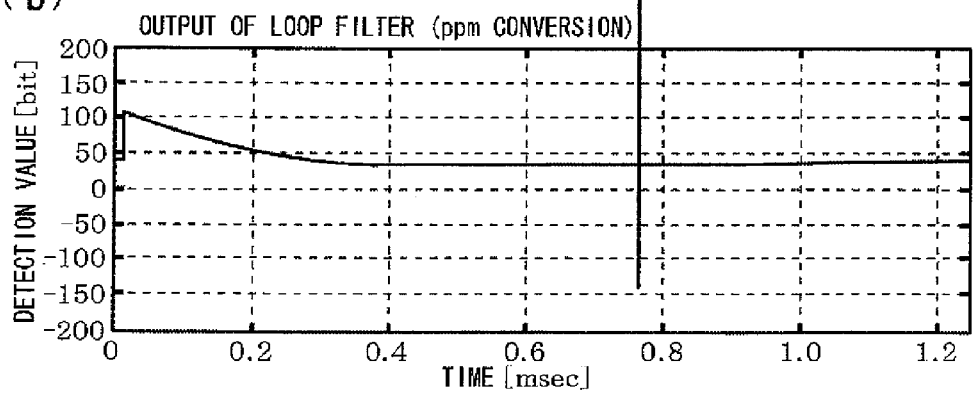

Contrary to this example, when Δfr is 6 MHz, and (f2−f1) is 5 MHz, the period of pulse for latch is longer than that of the saw-tooth wave, so that the latch point shown in FIG. 4(a) becomes gradually high, and in accordance with this, the output of the latch circuit 33 and the output of the loop filter 34 are also increased. Accordingly, since the value to be subtracted in the adding section 35 becomes large, the frequency of the saw-tooth wave is gradually lowered, and when the frequency soon reaches 5 MHz being the same frequency as that of (f2−f1), the PLL is locked. The direct-current voltage output from the loop filter 34 at this time takes a value corresponding to Δfr−(f2−f1)=1 MHz. Note that FIG. 6 show actual measured data, and in this example, the PLL is locked at a time t0.

Incidentally, as described above, the output of the frequency difference detecting unit 3, namely, an output of an averaging circuit 37 shown in FIG. 2 is actually a value that represents the value of {(f2−f1)/f1}−{(f2r−f1r)/f1r} by a 34-bit digital value. If it is set that (f1−f1r)/f1=OSC1 (a unit thereof is ppm or ppb), and (f2−f2r)/f2r=OSC2 (a unit thereof is ppm or ppb), a change in an aggregation of the value from the vicinity of −50° C. to the vicinity of 100° C. with respect to the temperature forms substantially the same curve as that of OSC2−OSC1. Therefore, the output of the frequency difference detecting unit 3 can be treated such that OSC2−OSC1=temperature data.

Further, since the operation of latching f2 based on f1 in the flip-flop circuit 31 is asynchronous, there is a possibility that an indefinite interval such as metastable (a state in which, when input data is latched at an edge of clock, the input data has to be held for a given period of time before and after the edge at which the latch is performed, but, the clock and the input data change at substantially the same time, so that an output becomes unstable) is generated, and thus an instantaneous error may be included in the output of the loop filter 34. In the aforementioned PLL, the output of the loop filter 34 is treated as the difference between Δfr and (f2−f1) being the value corresponding to the temperature, so that by providing the averaging circuit 37 that determines a moving average of the input value at a previously set time, on an output side of the loop filter 34, even if the instantaneous error is generated, the error is removed. By providing the averaging circuit 37, it is possible to obtain, conclusively, frequency deviation information corresponding to the amount of variation in temperature with high accuracy.

Figure 7:
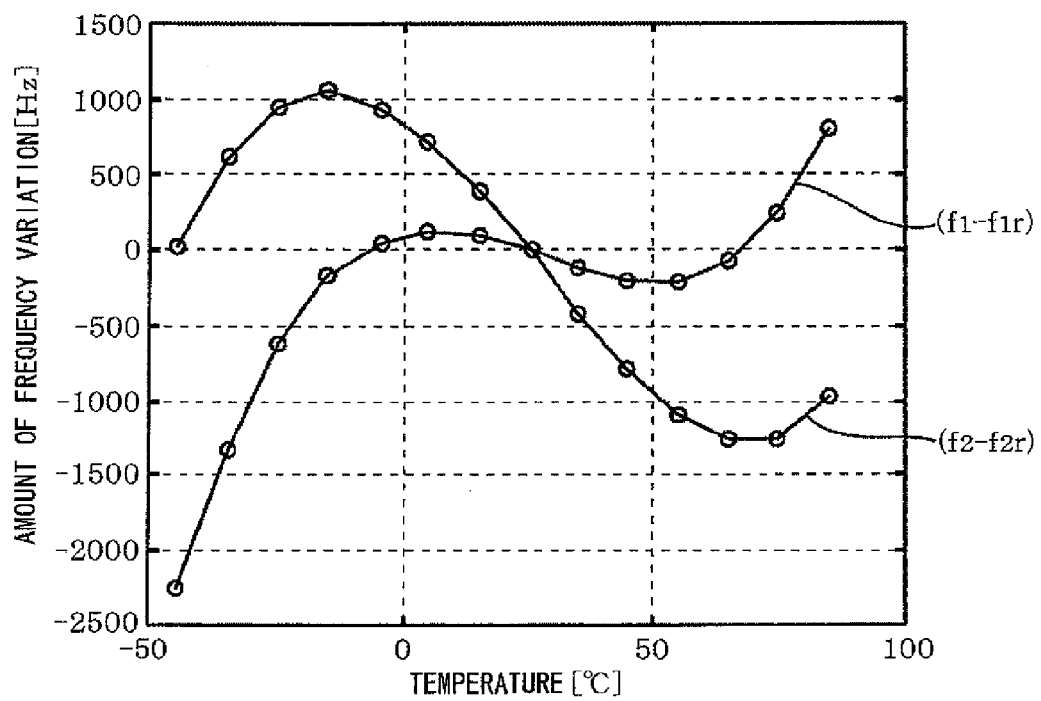
FIG. 7 is a frequency-temperature characteristic diagram showing relations between a frequency f1 of a first oscillation circuit and a temperature and between a frequency f2 of a second oscillation circuit and the temperature.

The frequency deviation information corresponding to the amount of variation in temperature obtained by the loop filter 34 of the PLL, which is Δfr−(f2−f1) in this example, is input into a compensation value calculating unit 4, which is a compensation value obtaining unit, shown in FIG. 1, in which a compensation value of frequency is calculated. Before making explanation on the compensation value calculating unit 4, the frequency deviation information and the frequency compensation value will be described with reference to FIG. 7 to FIG. 10. FIG. 7 is a characteristic diagram showing a relation between the temperature and the frequency after normalizing f1 and f2 using the reference temperature. The normalization described here means to determine a relation between a deviation amount of frequency with respect to a frequency at a reference temperature and the temperature, by setting 25° C. to the reference temperature, for example, and setting, regarding the relation between the temperature and the frequency, the frequency at the reference temperature to zero. If the frequency at 25° C. in the first oscillation circuit 1 is set to f1$r$, and the frequency at 25° C. in the second oscillation circuit 2 is set to f2$r$, namely, if the values of f1, f2 at 25° C. are set to f1$r$, f2$r$, respectively, values on a vertical axis in FIG. 7 represent (f1−f1$r$) and (f2−f2$r$).

Figure 8:
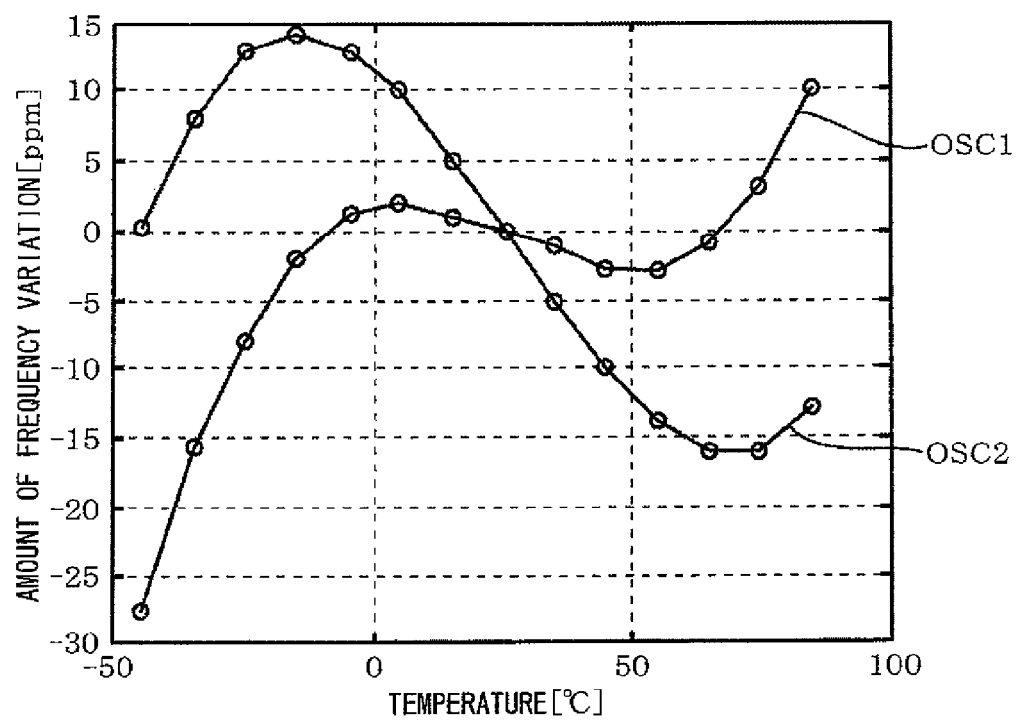
FIG. 8 is a frequency-temperature characteristic diagram showing relations between a value of normalized f1 and the temperature and between a value of normalized f2 and the temperature.

Further, FIG. 8 represents a rate of change of the frequency at each temperature shown in FIG. 7 with respect to the frequency at the reference temperature (25° C.). Therefore, values on a vertical axis in FIG. 8 represent (f1−f1$r$)/f1$r$ and (f2−f2$r$)/f2$r$, and these values are set to be represented by OSC1 and OSC2, respectively. Note that a unit of the value on the vertical axis in FIG. 8 is ppm.

Here, returning to the explanation of the frequency difference detecting unit 3, the frequency difference detecting unit 3 in this embodiment performs calculation for determining OSC2−OSC1, not the value of (f2−f2$r$)−(f1−f1$r$)=f2−f1−Δfr itself, as described above. Specifically, the frequency difference detecting unit 3 determines, regarding a value of ratio indicating that each frequency is deviated from the frequency at the reference temperature at how much ratio, a difference between the ratio in f2 and the ratio in f1. The frequency signal corresponding to (f2−f1) is input into the latch circuit 33, but, the saw-tooth wave is input into the PLL loop, so that it is possible to configure the circuit to conduct such calculation. If the output of the frequency difference detecting unit 3 is the 34-bit digital value, a value of 0.058 (ppb) per 1 bit is assigned, for example, and the value of OSC2−OSC1 achieves an accuracy as much as 0.058 (ppb). Note that grounds why it is possible to set the value of 0.058 (ppb) per 1 bit are based on later-described expressions (2) to (4). When the explanation of FIG. 6 is made at this stage, FIG. 6 represent output values of the latch circuit 33 and the loop filter 34 incorporated in an actual circuit when OSC2−OSC1 being the frequency difference between f1 and f2 (accurately, the difference in the rates of change of the frequencies) is 40 ppm.

Figure 9:
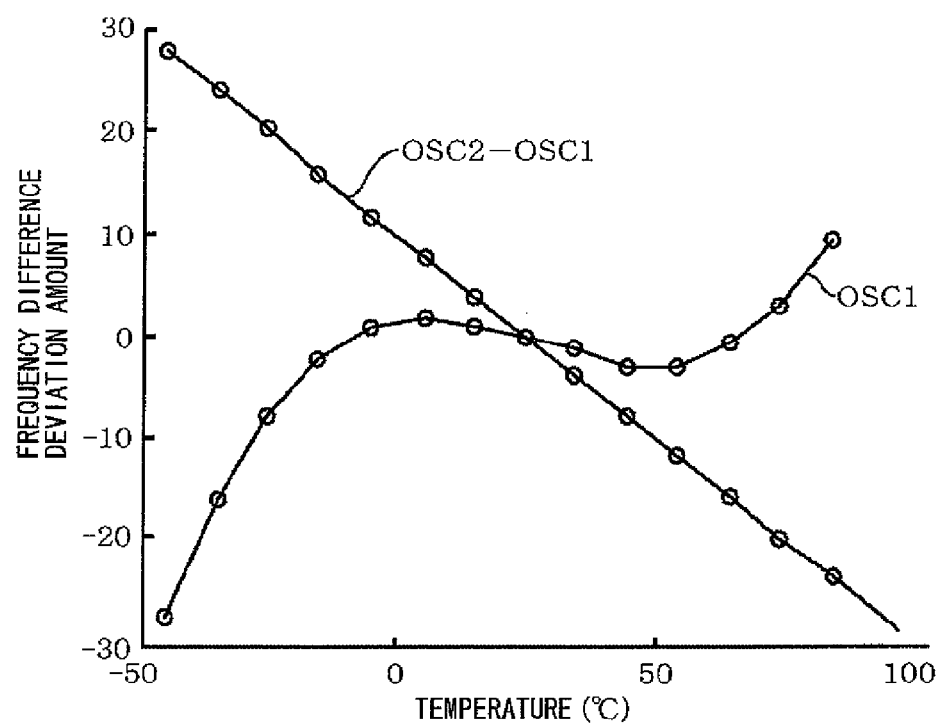
FIG. 9 is a frequency-temperature characteristic diagram showing a relation between the value of normalized f1 and the temperature and a relation between a difference Δf between the value of normalized f1 and the value of normalized f2 and the temperature.

FIG. 9 shows a relation between OSC1 and the temperature (which is the same as FIG. 8), and a relation between (OSC2−OSC1) and the temperature, in which it can be understood that (OSC2−OSC1) is in a linear relation with respect to the temperature. Therefore, it can be understood that (OSC2−OSC1) corresponds to the amount of deviation from the reference temperature due to the temperature variation. Further, generally, it is said that the frequency-temperature characteristic of the quartz-crystal oscillator is represented by a cubic function, if a relation between a frequency compensation value that cancels an amount of frequency variation obtained by the cubic function and (OSC2−OSC1) is determined, the frequency compensation value is determined based on a detection value of (OSC2−OSC1).

Figure 10:
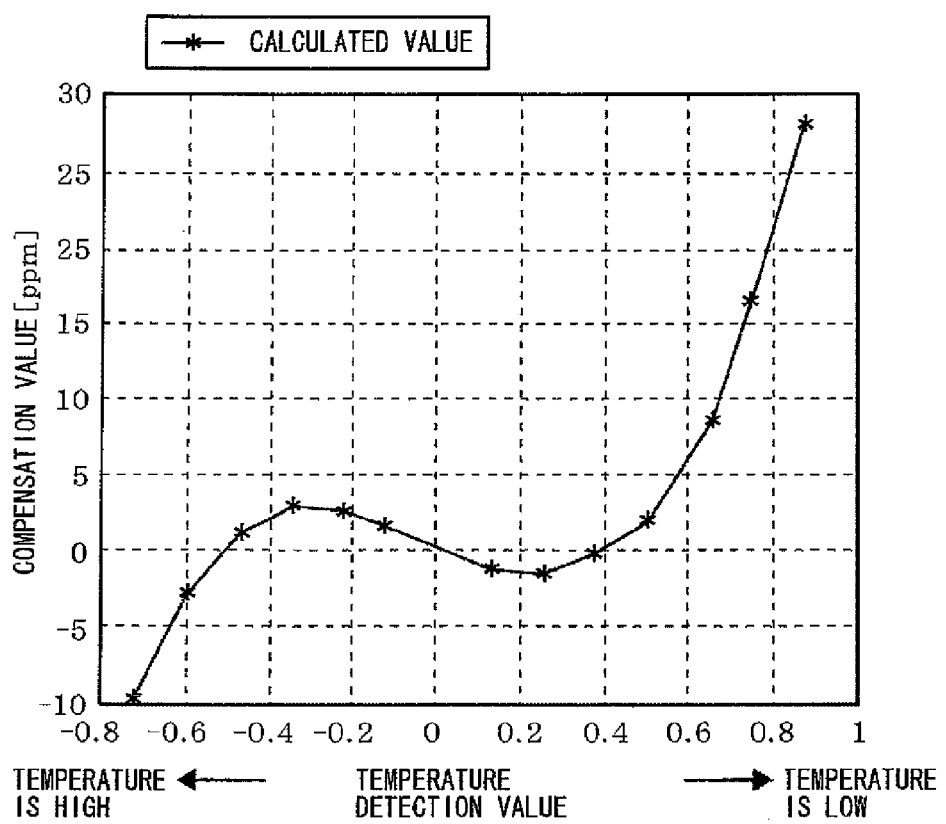
FIG. 10 is a characteristic diagram showing a relation between a value obtained by normalizing a vertical axis in FIG. 9 and a frequency compensation value.

As described above, the oscillation device of this embodiment uses the frequency signal obtained from the first oscillation circuit 1 (f1) as the reference clock of the control circuit unit 200 shown in FIG. 1, and the reference clock has the frequency-temperature characteristic, so that the temperature compensation is tried to be performed on the frequency of the reference clock. Accordingly, at first, a function representing a relation between the temperature and f1 normalized by the reference temperature is previously determined, and a function for cancelling the amount of frequency variation of f1 obtained by the function is determined as in FIG. 10. Therefore, a vertical axis in FIG. 10 is −OSC1. In this example, the aforementioned function is set to a ninth-order function, for example, in order to perform the temperature compensation with high accuracy.

As described above, since the temperature and (OSC2−OSC1) are in the linear relation, a horizontal axis in FIG. 10 is the value of (OSC2−OSC1), but, if the value of (OSC2−OSC1) is used as it is, an amount of data for specifying the value becomes large, so that the value of (OSC2−OSC1) is normalized as described below. Specifically, an upper limit temperature and a lower limit temperature under which the oscillation device will be actually used are set, and a value of (OSC2−OSC1) at the upper limit temperature is treated as +1, and a value of (OSC2−OSC1) at the lower limit temperature is treated as −1. In this example, as shown in FIG. 10, −30 ppm is set as +1, and +30 ppm is set as −1.

The frequency characteristic with respect to the temperature in the quartz-crystal oscillator is treated as a ninth-order polynomial approximate expression, in this example. Concretely, when producing the quartz-crystal oscillator, a relation between (OSC2−OSC1) and the temperature is obtained through actual measurement, and from the actual measurement data, a curve of compensation frequency indicating a relation between the temperature and −OSC1 cancelling an amount of frequency variation with respect to the temperature is derived, and coefficients of the ninth-order polynomial approximate expression are derived through a least square method. Further, the coefficients of the polynomial approximate expression are previously stored in the memory 30 (refer to FIG. 1), and the compensation value calculating unit 4 performs calculation processing of an expression (1) by using these coefficients of the polynomial approximate expression.

$$Y=P1 \cdot X^9+P2 \cdot X^8+P3 \cdot X^7+P4 \cdot X^6+P5 \cdot X^5+P6 \cdot X^4+P7 \cdot X^3+ \\ P8 \cdot X^2+P9 \cdot X \quad (1)$$

In the expression (1), X indicates frequency difference detection information, Y indicates compensation data, and P1 to P9 indicate the coefficients of the polynomial approximate expression.

Here, X is the value obtained by the frequency difference detecting unit 3 shown in FIG. 1, namely, the value (OSC2−OSC1) obtained by the averaging circuit 37 shown in FIG. 2.

Figure 11:
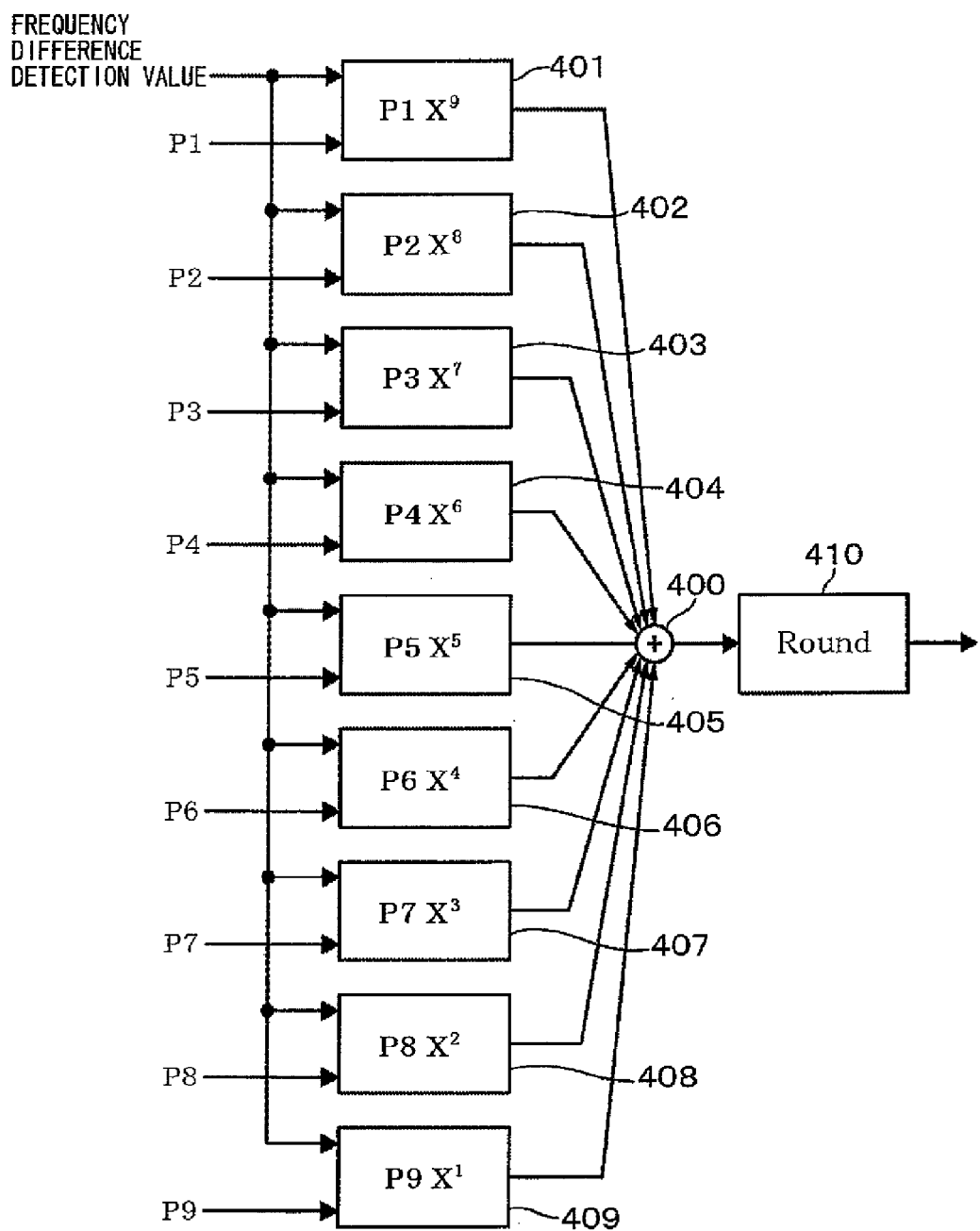
FIG. 11 is a block diagram showing a compensation value calculating unit.

An example of block diagram for executing the calculation in the compensation value calculating unit 4 is shown in FIG. 11. In FIG. 11, 401 to 409 denote calculating sections that perform the calculation of respective terms in the expression (1), 400 denotes an adding section, and 410 denotes a circuit that performs round processing. Note that it is also possible to structure the compensation value calculating unit 4 such that, for example, one multiplying section is used, a value of ninth-power term is determined in the multiplying section, and a value of eighth-power term is subsequently determined in the multiplying section, namely, the multiplying section is used in a sort of repeated manner, and values of respective power terms are finally added. Further, the arithmetic expression of the compensation value is not limited to the use of the ninth-order polynomial approximate expression, and it is also possible to use an approximate expression of an order in accordance with a required accuracy.

Next, the entire operation of the aforementioned embodiment will be summarized. The frequency signal output from the first oscillation circuit 1 is supplied as the clock signal to the DDS201 of the control circuit unit 200 for controlling the voltage controlled oscillator 100, and, as described in the beginning of the present embodiment, the frequency signal with the intended frequency is output from the voltage controlled oscillator 100 through the control operation in the control circuit unit 200. Meanwhile, the frequency signals f1, f2 respectively output from the first oscillation circuit 1 and the second oscillation circuit 2 are input into the frequency difference detecting unit 3, and, through the operation which has been already described in detail, the PLL is locked when the output of the PLL being the output of the frequency difference detecting unit 3 takes the value corresponding to $\{\Delta fr-(f2-f1)\}$ in this example, which is the value of (OSC2−OSC1) in this example. Further, the value is input into the compensation value calculating unit 4, and the calculation in the expression (1) is executed, resulting in that an amount of frequency compensation being temperature compensation data is obtained. The calculation in the expression (1) is processing for determining, in the characteristic diagram shown in FIG. 10, the value on the vertical axis of the curve of compensation frequency corresponding to the value obtained based on the output value of the frequency difference detecting unit 3, for example.

The frequency setting data (see FIG. 1) corresponding to setting value for setting output frequency of the voltage controlled oscillator 100 is input into the adding section 60, and the frequency setting data is added to the amount of frequency compensation being temperature compensation data therein.

As shown in FIG. 1, the first quartz-crystal oscillator 10 and the second quartz-crystal oscillator 20 are structured by using the common quartz-crystal piece Xb, and are thermally coupled to each other, so that the frequency difference between the oscillation circuits 11 and 12 takes a value which corresponds to the ambient temperature quite accurately, and accordingly, the output of the frequency difference detecting unit 3 is temperature difference information between the ambient temperature and the reference temperature (25° C., in this example). The frequency signal f1 output from the first oscillation circuit 11 is used as the main clock of the control circuit unit 200, so that the compensation value obtained by the compensation value calculating unit 4 is used as a signal for compensating the operation of the control circuit unit 200 for cancelling the influence on the operation of the control circuit unit 200 based on the amount of frequency deviation of f1 due to the deviation of temperature from 25° C. As a result of this, the output frequency of the voltage controlled oscillator 100 being the output of the oscillation device 1 of the present embodiment becomes stable regardless of the temperature variation.

As described above, according to the aforementioned embodiment, although the operating clock itself is varied by the temperature, it is possible to obtain accurate frequency deviation information corresponding to the amount of variation in temperature, and as a result of this, it is possible to realize a high-stability and high-accuracy oscillation device. Further, since the difference value between the value corresponding to the difference between f1 and f1r and the value corresponding to the difference between f2 and f2r is set to the frequency difference detection information (the frequency deviation information corresponding to the amount of variation in temperature), there is no need to perform troublesome work for adjusting f1 and f2 to satisfy f1≈f2, as in Patent Document 1, and further, there is no problem such that the yield of the quartz-crystal oscillator is lowered.

Further, in order to obtain the frequency difference detection information, the PLL is structured such that the pulse of difference frequency between f1 and f2 is created, the sawtooth wave signal output from the DDS circuit section is latched by the latch circuit based on the pulse, the value of the latched signal is integrated, the integral value is output as the frequency difference, and the difference between the output and the value corresponding to the difference between f1r and f2r is obtained to be input into the DDS circuit section. When, as in Patent Document 1, counting f1 and f2 and obtaining a difference thereof, the count time directly influences on the detection accuracy, but, with the structure as described above, there is no such problem, and thus there is provided a high detection accuracy. Actually, when both the methods are compared through simulation, in which a count time of 200 ms is set in the method of counting the frequencies, there is obtained a result that the detection accuracy in the method of the present embodiment is higher than that of the other method by about 50 times.

Further, the PLL of the present embodiment does not have a sinusoidal ROM table as a conventional DDS circuit section, and thus there is an advantage that a memory capacity can be reduced, resulting in that a scale of the device can be reduced. Further, since the compensation value of frequency is determined through the calculation processing based on the frequency deviation information corresponding to the amount of variation in temperature, there is no need to provide a memory with large capacity, and from this point as well, it is possible to reduce the scale of the device and to reduce the cost.

Figure 12:
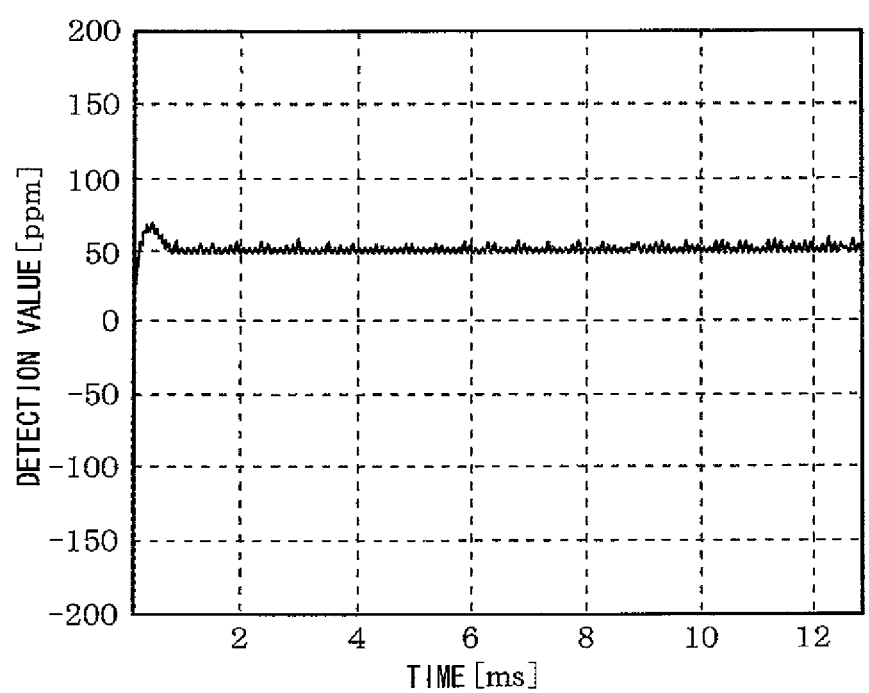
FIG. 12 is a characteristic diagram showing an operation simulation of a frequency difference detecting unit.

Here, a result obtained by examining, with the use of the circuit in FIG. 2, a relation between the frequency difference information being the output of the frequency difference detecting unit 3 and the time when f1 is 81.9 MHz and f2 is 76.69 MHz, is shown in FIG. 12. In this case, the frequency difference information is set to be (OSC2−OSC1), and a value thereof is +50 ppm.

Although the description is repeated, in this embodiment, the value corresponding to the difference between f1 and f1r is $\{(f1-f1r)/f1r\}$ (=OSC1), the value corresponding to the difference between f2 and f2r is $\{(f2-f2r)/f2r\}$ (=OSC2), and the value corresponding to the difference value between the value corresponding to the difference between f1 and f1r and the value corresponding to the difference between f2 and f2r is OSC2−OSC1. The present invention is not limited to this, and the frequency difference detecting unit 3 may also use the difference value between (f1−f1r) and (f2−f2r) itself, as the value corresponding to the difference value between the value corresponding to the difference between f1 and f1r and the value corresponding to the difference between f2 and f2r, and in this case, the graph in FIG. 7 is utilized to determine the temperature.

In the aforementioned embodiment, in the explanation from FIG. 8 to FIG. 10, the amount of change in the frequency is displayed in the unit of "ppm", but, it is all treated as a binary number in an actual digital circuit, so that a frequency setting accuracy of the DDS circuit section 36 is calculated by the number of configuration bits, for example, 34 bits. There can be cited an example as follows, in which a clock of 10 MHz is supplied to the DDS circuit section 201 included in the control circuit unit 200 shown in FIG. 1, a variable frequency of the clock being 100 Hz.

[Variable Ratio Calculation]

100 Hz/10 MHz=0.00001

[ppm Conversion]

0.00001*1e6=10 [ppm]

[DDS Setting Accuracy Conversion]

0.00001*2^34≈171.799 [ratio−34 bit (tentative name)]

In the above-described structure, the frequency setting accuracy can be represented by the following expression (2).

$$1\times[\text{ratio}-34\text{ bit}]=10\text{ M [Hz]}/2^{34}\approx 0.58\text{ m [Hz/bit]} \quad (2)$$

Therefore, the expression of 100 [Hz]/0.58 m [Hz/bit] ≈171.799 [bit (ratio−34 bit)] is satisfied.

Further, 0.58 mHz can be calculated with respect to 10 MHz as the following expression (3).

$$0.58\text{ m [Hz]}/10\text{ M [Hz]}*1e9\approx 0.058\text{ [ppb]} \quad (3)$$

Therefore, from the expressions (2), (3), a relation of expression (4) is satisfied.

$$1e9/2^{34}=0.058\text{ [ppb/ratio}-34\text{ bit]} \quad (4)$$

Specifically, the frequency processed in the DDS circuit section 36 is eliminated, and a relation with only the number of bits is satisfied.

Furthermore, in the aforementioned example, the first quartz-crystal oscillator 10 and the second quartz-crystal oscillator 20 use the common quartz-crystal piece Xb, but, it is also possible that the quartz-crystal piece Xb is not used in a shared manner. In this case, there can be cited an example in which the first quartz-crystal oscillator 10 and the second quartz-crystal oscillator 20 are disposed in a common casing, for example. With such structure, since both the oscillators are placed under substantially the same temperature environment, it is possible to achieve the similar effect.

The output signal of the DDS circuit section 36 of the frequency difference detecting unit 3 is not limited to the saw-tooth wave, and it is only required to be a frequency signal whose signal value repeatedly increases and decreases with time such as, for example, a sine wave.

Further, the frequency difference detecting unit 3 may also be structured to count f1 and f2 by using a counter, subtract a value corresponding to Δfr from a difference value between the count values, and output a value corresponding to the obtained count value.

The present invention is made on the premise that the output of the oscillation device is generated by utilizing the output of the first oscillation circuit 1, and as an example of the present invention, in the aforementioned embodiment, the frequency signal f1 obtained from the first oscillation circuit 1 is used as the reference clock of the control circuit unit 200 (specifically, the DDS circuit section 201) shown in FIG. 1. However, as an example in which the output of the oscillation device is generated by utilizing the output of the first oscillation circuit 1, it is also possible to adopt an example in which the output of the first oscillation circuit 1 is used as it is, as the output of the oscillation device, as in the general TCXO shown in FIG. 13.

Figure 13:
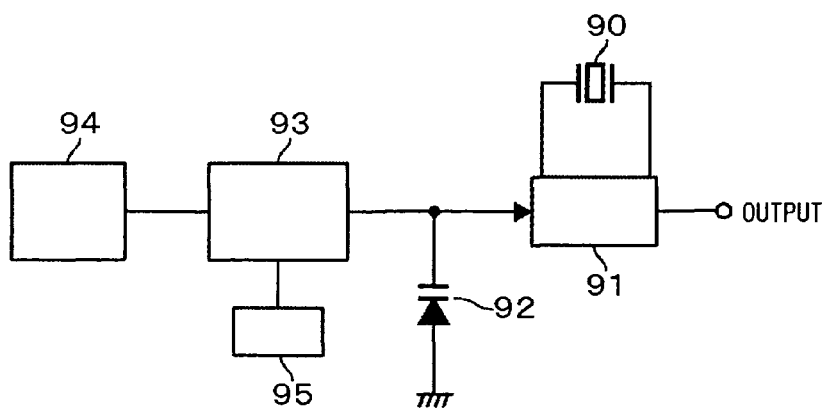
FIG. 13 is a structural diagram showing a conventional TCXO.

In this case, the temperature characteristic of the output frequency of the first oscillation circuit 1 directly becomes the temperature characteristic of the oscillation output. Therefore, it is also possible that the frequency difference information obtained by the frequency difference detecting unit 3, instead of the output of the temperature detector 94 shown in FIG. 13, is used, an amount of compensation of the control voltage (corresponding to a set signal setting the frequency) comparable to the amount of frequency compensation is determined based on the information, and the amount of compensation and the reference voltage for outputting the frequency at the reference temperature are added in the control voltage generating unit 93 to set it to the control voltage. The method of determining the amount of frequency compensation from the frequency difference information is not limited to the use of polynomial approximate expression as in the aforementioned embodiment, and it may also be a method in which a table representing a relation between the frequency difference information and the amount of frequency compensation is previously stored in the memory, and the table is referred to.

In the above-described embodiment, the frequency difference between the first quartz-crystal oscillator 10 and the second quartz-crystal oscillator 20 is used as a sort of temperature measurement value, and based on the temperature measurement value, the frequency compensation value with respect to the temperature variation of the first quartz-crystal oscillator 10 is determined. However, also when the present invention adopts a structure in which a quartz-crystal oscillator to be a target of frequency compensation and one of the two quartz-crystal oscillators that form a sort of thermometer are not made common, it falls within the technical scope of the present invention. In this case, a third quartz-crystal oscillator other than the first quartz-crystal oscillator 10 and the second quartz-crystal oscillator 20 is used, and the output of the oscillation device is generated by utilizing an output of an oscillation circuit connected to the third quartz-crystal oscillator. It is also possible that the first quartz-crystal oscillator 10, the second quartz-crystal oscillator 20 and the third quartz-crystal oscillator are structured on a common quartz-crystal piece, for example, or they are not structured on the common quartz-crystal piece, but are stored in the same container, for example, so as to be placed in the same ambient temperature atmosphere.

It can be said that the compensation value obtaining unit in this case obtains, based on the value corresponding to the difference value detected by the frequency difference detecting unit and a relation between the value corresponding to the difference value and a frequency compensation value of an oscillation frequency f0 of another oscillation circuit for oscillating another quartz-crystal oscillator different from the first quartz-crystal oscillator and the second quartz-crystal oscillator, the frequency compensation value of f0, instead of obtaining, based on the value corresponding to the difference value detected by the frequency difference detecting unit and the relation between the value corresponding to the difference value and the frequency compensation value of the oscillation frequency f1 of the first oscillation circuit, the frequency compensation value of f1.

What is claimed is:

1. An oscillation device compensating a set value of an output frequency based on a detection result of ambient temperature, said oscillation device comprising:
   a first quartz-crystal oscillator structured by providing first electrodes on a quartz-crystal piece;
   a second quartz-crystal oscillator structured by providing second electrodes on a quartz-crystal piece;
   a first oscillation circuit and a second oscillation circuit connected to said first quartz-crystal oscillator and said second quartz-crystal oscillator, respectively;
   a frequency difference detecting unit determining, when an oscillation frequency of said first oscillation circuit is set to f1, an oscillation frequency of said first oscillation circuit at a reference temperature is set to f1$r$, an oscillation frequency of said second oscillation circuit is set to f2, and an oscillation frequency of said second oscillation circuit at the reference temperature is set to f2$r$, a value corresponding to a difference value between a value corresponding to a difference between f1 and f1$r$, and a value corresponding to a difference between f2 and f2$r$; and
   a compensation value obtaining unit obtaining a frequency compensation value of f1 because the ambient temperature is different from the reference temperature, based on the value corresponding to the difference value detected by said frequency difference detecting unit, and a relation between the value corresponding to the difference value and the frequency compensation value of the oscillation frequency f1 of said first oscillation circuit; and
   wherein the value corresponding to the difference value between the value corresponding to the difference between f1 and f1$r$ and the value corresponding to the difference between f2 and f2$r$ is $[\{(f2-f2r)/f2r\}-\{(f1-f1r)/f1r\}]$;
   wherein an output of said oscillation device is structured to be generated by utilizing an output of said first oscillation circuit; and
   wherein the set value of the output frequency is structured to be compensated based on the frequency compensation value determined by said compensation value obtaining unit.

2. The oscillation device according to claim 1, wherein said compensation value obtaining unit obtains the frequency compensation value of f1 through calculation, based on a relational expression specifying the relation between the value corresponding to the difference value and the frequency compensation value of the oscillation frequency f1 of said first oscillation circuit.

3. An oscillation device compensating a set value of an output frequency based on a detection result of ambient temperature, said oscillation device comprising:
   a first quartz-crystal oscillator structured by providing first electrodes on a quartz-crystal piece:
   a second quartz-crystal oscillator structured by providing second electrodes on a quartz-crystal piece:
   a first oscillation circuit and a second oscillation circuit connected to said first quartz-crystal oscillator and said second quartz-crystal oscillator, respectively:
   a frequency difference detecting unit determining, when an oscillation frequency of said first oscillation circuit is set to f1, an oscillation frequency of said first oscillation circuit at a reference temperature is set to f1$r$, an oscillation frequency of said second oscillation circuit is set to f2, and an oscillation frequency of said second oscillation circuit at the reference temperature is set to f2$r$, a value corresponding to a difference value between a value corresponding to a difference between f1 and f1$r$, and a value corresponding to a difference between f2 and f2$r$; and
   a compensation value obtaining unit obtaining a frequency compensation value of f1 because the ambient temperature is different from the reference temperature, based on the value corresponding to the difference value detected by said frequency difference detecting unit, and a relation between the value corresponding to the difference value and the frequency compensation value of the oscillation frequency f1 of said first oscillation circuit; and
   wherein said frequency difference detecting unit comprises: a pulse creating section creating a pulse of difference frequency between the f1 and f2; a DDS circuit section outputting a frequency signal whose signal value repeatedly increases and decreases with time by a frequency in accordance with a magnitude of an input direct-current voltage; a latch circuit latching, based on the pulse created by the pulse creating section, the frequency signal output from the DDS circuit section;
   a loop filter integrating a value of the signal latched by the latch circuit and outputting the integral value as a value corresponding to the difference value; and
   an adding section obtaining a difference between the output of the loop filter and a value corresponding to a difference between f1$r$ and f2$r$ to set it as an input value to be input into the DDS circuit section;
   wherein an output of said oscillation device is structured to be generated by utilizing an output of said first oscillation circuit; and
   wherein the set value of the output frequency is structured to be compensated based on the frequency compensation value determined by said compensation value obtaining unit.

4. The oscillation device according to claim 1, wherein the quartz-crystal piece of said first quartz-crystal oscillator and the quartz-crystal piece of said second quartz-crystal oscillator are made common.

5. An oscillation device compensating a set value of an output frequency based on a detection result of ambient temperature, said oscillation device comprising:
   a first quartz-crystal oscillator structured by providing first electrodes on a quartz-crystal piece;
   a second quartz-crystal oscillator structured by providing second electrodes on a quartz-crystal piece;
   a first oscillation circuit and a second oscillation circuit connected to said first quartz-crystal oscillator and said second quartz-crystal oscillator, respectively;
   a frequency difference detecting unit determining, when an oscillation frequency of said first oscillation circuit is set to f1, an oscillation frequency of said first oscillation circuit at a reference temperature is set to f1$r$, an oscillation frequency of said second oscillation circuit is set to f2, and an oscillation frequency of said second oscillation circuit at the reference temperature is set to f2$r$, a value corresponding to a difference value between a value corresponding to a difference between f1 and f1$r$, and a value corresponding to a difference between f2 and f2$r$; and
   a compensation value obtaining unit obtains, based on the value corresponding to the difference value detected by said frequency difference detecting unit and a relation between the value corresponding to the difference value and a frequency compensation value of an oscillation frequency f0 of another oscillation circuit for oscillating another quartz-crystal oscillator different from said first quartz-crystal oscillator and said second quartz-crystal oscillator, the frequency compensation value of f0 because the ambient temperature is different from the reference temperature;

wherein an output of said oscillation device is structured to be generated by utilizing an output of said first oscillation circuit; and wherein the set value of the output frequency is structured to be compensated based on the frequency compensation value determined by said compensation value obtaining unit.

6. The oscillation device according to claim 3, wherein said compensation value obtaining unit obtains the frequency compensation value of f1 through calculation, based on a relational expression specifying the relation between the value corresponding to the difference value and the frequency compensation value of the oscillation frequency f1 of said first oscillation circuit.

7. The oscillation device according to claim 3, wherein the quartz-crystal piece of said first quartz-crystal oscillator and the quartz-crystal piece of said second quartz-crystal oscillator are made common.

8. The oscillation device according to claim 5, wherein said compensation value obtaining unit obtains the frequency compensation value of f1 through calculation, based on a relational expression specifying the relation between the value corresponding to the difference value and the frequency compensation value of the oscillation frequency f1 of said first oscillation circuit.

9. The oscillation device according to claim 5, wherein the quartz-crystal piece of said first quartz-crystal oscillator and the quartz-crystal piece of said second quartz-crystal oscillator are made common.

* * * * *